United States Patent
McHugh et al.

(10) Patent No.: US 11,984,358 B2
(45) Date of Patent: May 14, 2024

(54) SYSTEMS AND METHODS FOR IMPROVING WITHIN DIE CO-PLANARITY UNIFORMITY

(71) Applicant: Applied Materials, Inc., Santa Clara, CA (US)

(72) Inventors: Paul McHugh, Kalispell, MT (US); Kwan Wook Roh, Kalispell, MT (US); Gregory J. Wilson, Kalispell, MT (US)

(73) Assignee: Applied Materials, Inc., Santa Clara, CA (US)

( * ) Notice: Subject to any disclaimer, the term of this patent is extended or adjusted under 35 U.S.C. 154(b) by 85 days.

(21) Appl. No.: 17/742,962

(22) Filed: May 12, 2022

(65) Prior Publication Data

US 2022/0270923 A1    Aug. 25, 2022

Related U.S. Application Data

(62) Division of application No. 16/572,920, filed on Sep. 17, 2019, now Pat. No. 11,367,653.

(Continued)

(51) Int. Cl.
*H01L 21/768* (2006.01)
*G06F 30/394* (2020.01)
(Continued)

(52) U.S. Cl.
CPC ...... *H01L 21/76883* (2013.01); *G06F 30/394* (2020.01); *H01L 21/2885* (2013.01);
(Continued)

(58) Field of Classification Search
CPC ........... H01L 21/76877; H01L 21/2885; H01L 21/76816; H01L 21/76883; H01L 23/522; H01L 22/20; H01L 22/30
See application file for complete search history.

(56) References Cited

U.S. PATENT DOCUMENTS

| | | | |
|---|---|---|---|
| 5,601,678 A | 2/1997 | Gerber et al. | |
| 6,184,137 B1 * | 2/2001 | Ding | H01L 21/76877 |
| | | | 257/E21.585 |

(Continued)

FOREIGN PATENT DOCUMENTS

| | | |
|---|---|---|
| JP | 2003142546 A | 5/2003 |
| JP | 2006156998 A | 6/2006 |
| JP | 2016111047 A | 6/2016 |

OTHER PUBLICATIONS

Application No. PCT/US2019/050825, International Preliminary Report on Patentability, dated Apr. 1, 2021, 7 pages.

(Continued)

*Primary Examiner* — Michael M Trinh
(74) *Attorney, Agent, or Firm* — Kilpatrick Townsend & Stockton LLP

(57) ABSTRACT

Exemplary methods of producing a semiconductor substrate may include plating a metal within a plurality of vias on the semiconductor substrate. A target average fill thickness of the metal within the plurality of vias may be between about a thickness equal to an average via radius of the plurality of vias and a thickness twice the average via radius of the plurality of vias. At least one via of the plurality of vias may be filled to a height below the target average fill thickness of the metal. The methods may include heating the metal to cause reflow of the metal within each via of the plurality of vias. The reflow may adjust the metal within the at least one via to increase in height towards the target average fill thickness.

18 Claims, 6 Drawing Sheets

Related U.S. Application Data

(60) Provisional application No. 62/733,800, filed on Sep. 20, 2018.

(51) Int. Cl.
*H01L 21/288* (2006.01)
*H01L 23/522* (2006.01)

(52) U.S. Cl.
CPC .. *H01L 21/76816* (2013.01); *H01L 21/76877* (2013.01); *H01L 23/522* (2013.01)

(56) References Cited

U.S. PATENT DOCUMENTS

| | | |
|---|---|---|
| 7,544,280 B2 | 6/2009 | Shimizu |
| 9,252,100 B2 | 2/2016 | Allen et al. |
| 10,741,514 B2 * | 8/2020 | Aoki ................ H01L 24/02 |
| 2002/0163086 A1 * | 11/2002 | Toyoda ............ H01L 21/76808 |
| | | 257/E23.152 |
| 2004/0265562 A1 | 12/2004 | Uzoh et al. |
| 2014/0343901 A1 | 11/2014 | Sun et al. |
| 2015/0348872 A1 | 12/2015 | Kuo et al. |
| 2016/0283631 A1 | 9/2016 | Lin et al. |
| 2017/0069554 A1 | 3/2017 | Birner et al. |
| 2017/0200642 A1 * | 7/2017 | Shaviv ............ H01L 21/76879 |
| 2020/0170121 A1 * | 5/2020 | Lecordier ............ H05K 3/3485 |

OTHER PUBLICATIONS

Application No. PCT/US2019/050825, International Search Report and Written Opinion, dated Jan. 3, 2020, 10 pages.

* cited by examiner

SYSTEMS AND METHODS FOR IMPROVING WITHIN DIE CO-PLANARITY UNIFORMITY

CROSS-REFERENCES TO RELATED APPLICATIONS

This application is a divisional of U.S. Non-Provisional patent application Ser. No. 16/572,920, filed Sep. 17, 2019, which claims the benefit of U.S. Provisional Patent Application No. 62/733,800, filed on Sep. 20, 2018, and which is hereby incorporated by reference in its entirety for all purposes.

TECHNICAL FIELD

The present technology relates to plating conductive material on substrates in semiconductor processing. More specifically, the present technology relates to systems and methods that improve within-die, co-planarity uniformity for metal plating in semiconductor processing.

BACKGROUND

Integrated circuits are made possible by processes which produce intricately patterned material layers on substrate surfaces. After formation, etching, and other processing on a substrate, metal or other conductive materials are often deposited or formed to provide the electrical connections between components. Because this metallization may be performed after many manufacturing operations, problems caused during the metallization may create expensive waste substrates or wafers.

During formation of metal materials on a wafer or substrate, a substrate may be submerged within a plating bath followed by metal formation on the substrate. Several issues may occur during this process. For example, semiconductor substrates may include a number of vias, trenches, or other features that are to be plated, and these features may have different geometries. Additionally, aspects of the substrate layout may affect the rate of filling and variation between different regions of the substrate. Consequently, some vias or features may not be filled to the same level as other features, which may cause coupling issues in later fabrication.

Thus, there is a need for improved systems and methods that can be used to produce high quality devices and structures that increase uniformity during plating operations. These and other needs are addressed by the present technology.

SUMMARY

Exemplary methods of producing a semiconductor substrate may include characterizing a substrate pattern to identify a zonal distribution of a plurality of vias and a height and a radius of each via of the plurality of vias. The methods may include determining a fill rate for each via within the zonal distribution of the plurality of vias. The methods may include modifying a die pattern to adjust via fill rates between two zones of vias. The methods may also include producing a substrate according to the die pattern.

In some embodiments, the modifying may include increasing or decreasing via radius on one zone of the two zones of vias on the die pattern. The modifying may include increasing or decreasing a percentage open area in one zone of the two zones of vias on the die pattern. The methods may also include filling vias on the substrate with a first metal followed by a second metal. The second metal may be characterized by a melting temperature below a melting temperature of the first metal. The methods may include performing a reflow operation of the second metal to produce an arcuate shape for the second metal within each via. The vias may be filled to a height where an average fill height of the second metal is less than or about twice an average via radius of the plurality of vias. Subsequent the reflow operation, at least one via characterized by a pre-flow fill height of the second metal greater than the average fill height of the second metal may be characterized by a post-reflow fill height less than the pre-flow fill height of the second metal. Subsequent the reflow operation, at least one via characterized by a pre-flow fill height of the second metal less than the average fill height of the second metal may be characterized by a post-reflow fill height greater than the pre-flow fill height of the second metal.

Some embodiments of the present technology may also encompass methods of filling vias in a semiconductor substrate. The methods may include plating a metal within a plurality of vias on the semiconductor substrate. A target average fill thickness of the metal within the plurality of vias may be between about a thickness equal to an average via radius of the plurality of vias and a thickness twice the average via radius of the plurality of vias. At least one via of the plurality of vias may be filled to a height below the target average fill thickness of the metal. The methods may also include heating the metal to cause reflow of the metal within each via of the plurality of vias. The reflow may adjust the metal within the at least one via to increase in height towards the target average fill thickness.

In some embodiments, the target average fill thickness of the metal within the plurality of vias may be about equal to the average via radius of the plurality of vias times about 1.5 to about 2. The metal may be a first metal and the first metal may be formed overlying a second metal within each via of the plurality of vias. The first metal may be characterized by a melting point below or about 200° C. The first metal may include tin silver, and the second metal may include one or more metals selected from the group including copper, cobalt, nickel, or tungsten. The methods may also include including a third metal formed within each via of the plurality of vias. The second metal may include copper, and the third metal may include nickel. Adjusting the metal within the at least one via of the plurality of vias may include modifying a geometry of the metal within the at least one via of the plurality of vias. The metal may be characterized by a pre-reflow cylindrical geometry and the metal may be characterized by a post-reflow hemispherical geometry. The methods may also include a second via of the plurality of vias separate from the at least one via and having the metal within the via filled to a height above the target average fill thickness of the metal. The reflow may adjust the metal within the second via to decrease in height towards the target average fill thickness of the metal.

Some embodiments of the present technology may also include producing a semiconductor substrate. The methods may include characterizing a substrate pattern to identify a zonal distribution of a plurality of vias and a height and a radius of each via of the plurality of vias. The methods may include determining a fill rate for each via within the zonal distribution of the plurality of vias. The methods may include modifying a die pattern to adjust via fill rates between two zones of vias. The methods may include producing a semiconductor substrate according to the die pattern. The methods may include plating a metal within the plurality of vias on the semiconductor substrate produced. A target average fill thickness of the metal within the plurality of vias may be between about a thickness equal to an average via radius of the plurality of vias and a thickness twice the average via radius of the plurality of vias. At least one via of the plurality of vias may be filled to a height below the target average fill thickness of the metal. The methods may also include heating the metal to cause reflow of the metal within each via of the plurality of vias. The reflow may adjust the metal within the at least one via to increase in height towards the target average fill thickness.

In some embodiments, subsequent the reflow, a total fill height of metal within each via of the plurality of vias may be within 5% of an average total fill height of metal within each via of the plurality of vias. The methods may also include a second via of the plurality of vias separate from the at least one via and having the metal within the via filled to a height above the target average fill thickness of the metal. The reflow may adjust the metal within the second via to decrease in height towards the target average fill thickness of the metal.

Such technology may provide numerous benefits over conventional technology. For example, the present operations may increase uniformity of fill co-planarity between features on a semiconductor substrate by leveraging reflow characteristics of certain materials used in metallization. Additionally, some embodiments of the present technology may improve device layouts that may increase fill uniformity within device features. These and other embodiments, along with many of their advantages and features, are described in more detail in conjunction with the below description and attached figures.

BRIEF DESCRIPTION OF THE DRAWINGS

A further understanding of the nature and advantages of the disclosed embodiments may be realized by reference to the remaining portions of the specification and the drawings.

Figure 1:
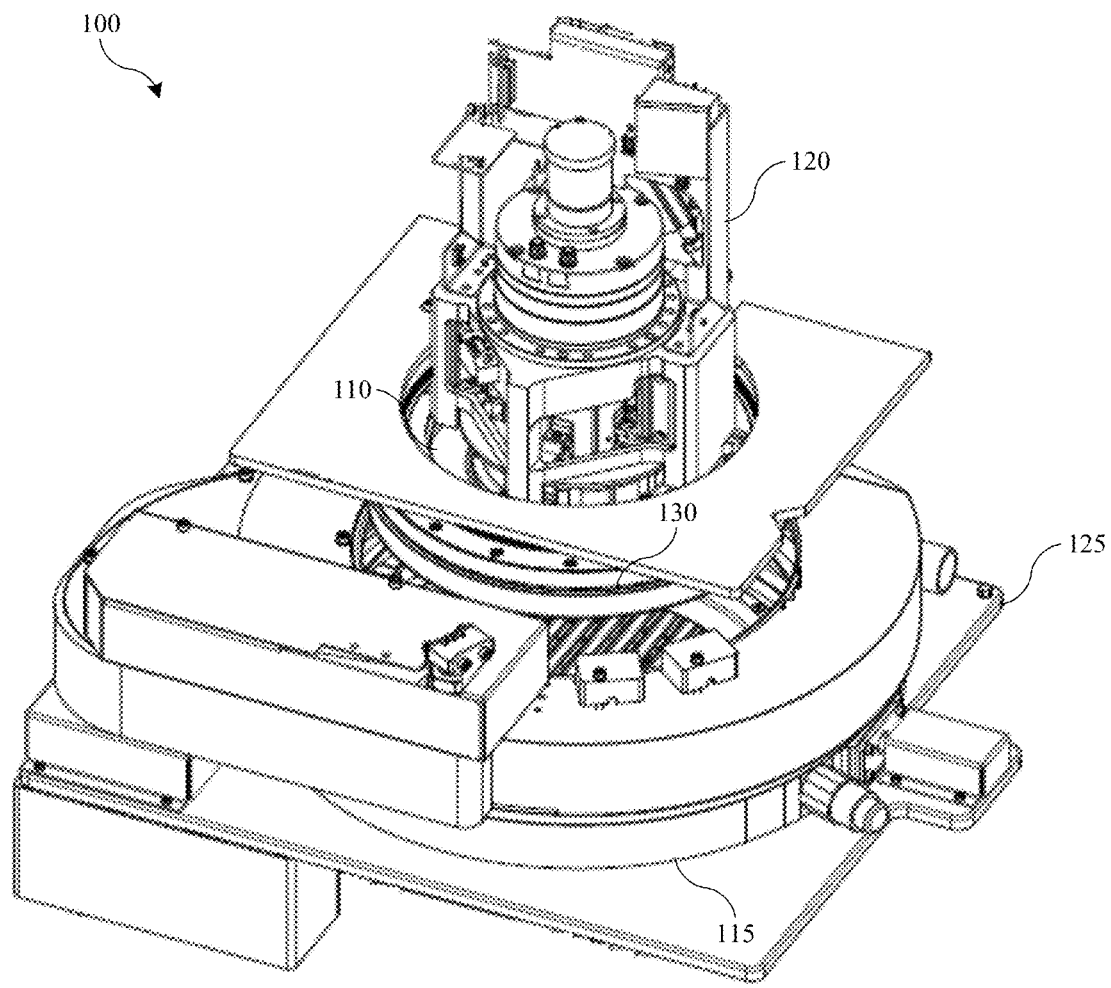
FIG. 1 shows a schematic cross-sectional view of a chamber in which methods may be practiced according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the figures, similar components and/or features may have the same numerical reference label. Further, various components of the same type may be distinguished by following the reference label by a letter that distinguishes among the similar components and/or features. If only the first numerical reference label is used in the specification, the description is applicable to any one of the similar components and/or features having the same first numerical reference label irrespective of the letter suffix.

DETAILED DESCRIPTION

Various operations in semiconductor manufacturing and processing are performed to produce vast arrays of features across a substrate. As layers of semiconductor features are formed, vias, trenches, and other pathways are produced within the structure. These features may then be filled with a conductive or metal material that allows electricity to conduct through the device from layer to layer. As device features continue to shrink in size, so too does the amount of metal providing conductive pathways through the substrate. As the amount of metal is reduced, the quality and uniformity of the fill may become more critical to ensure adequate electrical conductivity through the device.

Electroplating operations may be performed to provide conductive material into vias and other features on a substrate. Electroplating may utilize an electrolyte bath containing ions of the conductive material to electrochemically deposit the conductive material onto the substrate and into the features defined on the substrate. Features may be filled with one or more metals or conductive materials to a target fill height in the feature. The target fill height may be based on affording coupling for later operations. For example, subsequent a metal or conductive fill, dicing may occur followed by connecting the individual devices to other substrates. The coupling may involve placing conductive materials, such as solder bumps, on an exposed surface of the metal material on each feature, to produce the conductive connection through the via or feature to the subsequent device. Accordingly, the fill height of the metal material may impact the connection. For example, if insufficient metal or conductive material is formed within the via or feature, the solder bump may be incapable of contacting the metal, and thus the feature connection may not occur. In one non-limiting example, metal pillars, which may include a number of metals as will be described below, may be used to connect an interposer with a logic die, as well as memory dies with the logic die. When insufficient fill occurs for these pillars, coupling between the dies may not be fully consistent, and performance may be degraded.

Conventional technologies have struggled with accommodating these issues because of the variety of features and geometries across a substrate. For example, features of different sizes or at different locations may fill at different speeds, as will be described further below, and thus the conductive fill in some features may not have sufficiently occurred prior to overfill in other features. Thus, many conventional technologies have often accepted certain losses occurring from incomplete coupling, or have been incapable of producing newer, higher quality devices having more features or a greater variety of features.

The present technology overcomes these deficiencies in a number of ways. In some embodiments, the via formation process itself may be adjusted to provide improvements in fill by increasing uniformity of feature fill rates during plating operations. Additionally, fill and reflow operations may be adjusted to increase co-planarity uniformity of post-reflow fill heights within features. In some embodiments, these processes may be combined to both adjust features on a substrate as well as leveraging reflow characteristics within the features. By performing any of these operations, fill height within vias may be more uniform across a substrate, improving co-planarity and the coupling facility at more locations. After describing an exemplary chamber in which exemplary filling operations may be performed, the description will turn to improving uniformity of co-planarity among features on a substrate.

FIG. 1 shows a schematic perspective view of an electroplating system 100 in which methods of plating semiconductor substrates may be performed according to some embodiments of the present technology. Electroplating system 100 illustrates an exemplary electroplating system including a system head 110 and a bowl 115. During electroplating operations, a wafer may be clamped to the system head 110, inverted, and extended into bowl 115 to perform an electroplating operation. Electroplating system 100 may include a head lifter 120, which may be configured to both raise and rotate the head 110, or otherwise position the head within the system including tilting operations. The head and bowl may be attached to a deck plate 125 or other structure that may be part of a larger system incorporating multiple electroplating systems 100, and which may share electrolyte and other materials.

A rotor may allow a substrate clamped to the head to be rotated within the bowl, or outside the bowl in different operations. The rotor may include a contact ring, which may provide the conductive contact with the substrate. A seal 130 may be connected with the head, and may include a chucked wafer to be processed. FIG. 1 illustrates one exemplary electroplating chamber in which one or more plating or filling operations may be performed as will be described further below. It is to be understood that other configurations are possible, and virtually any plating chamber may be used with aspects of the present technology. Accordingly, it is to be understood that the present technology is not limited to any particular plating system, and may be performed with a variety of equipment and processes.

Figure 2:
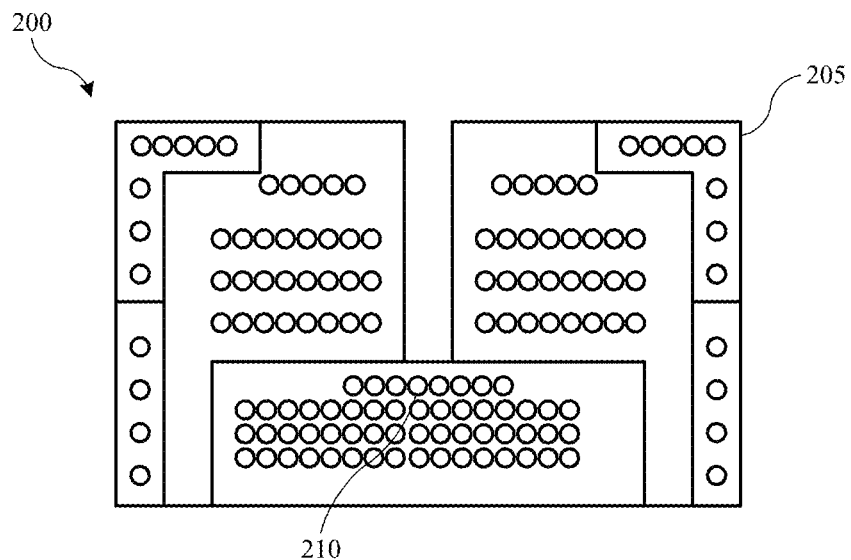
FIG. 2 shows a schematic top view of a zonal layout on a device according to some embodiments of the present technology.

FIG. 2 shows a schematic top view of a zonal distribution or layout on a device 200 according to some embodiments of the present technology. During development of transistors or other semiconductor processing, a number of vias may be formed across the device to provide paths for conductive material to be disposed and produce the electrical connections within the device, and provide the external access location for additional electrical coupling, such as where bumps are used to connect two components. Filling of the vias, or other features, may occur in a plating chamber, such as described with system 100 above. The plating may occur to fill the vias with one or more metals up to a specified or target fill height affording connection locations.

As noted above, a variety of aspects may impact fill rates and affect overall fill heights. For example, device 200 has illustrated zones that may be impacted during filling operations in different ways. The zones may be segregated in a simulation based on fill rates where vias within an identified zone may be filled to similar heights, may have similar geometries, or both. The distribution of vias within the zones and the location of zones on a larger substrate or wafer may both affect fill rates within the individual vias or features. For example, zones having vias adjacent to material regions having no vias may tend to plate thicker than more central regions, which may result from current-crowding effects. For example, in zone 205, which may reside at the edge of a device, no additional vias may be outside of the periphery, which may be photoresist or other materials. Accordingly, the vias may plate more heavily than in a central region of zone 210, which may be mostly surrounded by other features and vias.

Open area may also impact the fill rates of individual vias within a zone. Open area may correspond to an area open for plating, and thus a lower open area may correspond to a region having fewer vias available for plating. In those regions of lower open area, vias of the same size as vias in a region having higher open area may plate thicker than the vias in the region having higher open area. Put another way, two areas of the same size may be characterized by a different amount of open area. The current extending into these regions may be similar, but the electric field may adjust differently in the zones. Although the electric field will adjust, in general more current may extend into the region of reduced open area increasing the fill in that region. These affects may create a distribution of fill across the vias and regions of the device. Although an average target fill height may be achieved, a potentially large number of vias may not be adequately filled, while other vias may be overfilled. Consequently, the number of available connections may be insufficient, which may result in device yield loss.

The present technology may overcome these issues in a number of ways. In some embodiments, the device and vias may be modified to create more uniform fill rates. For example, when new device layouts are being developed, aspects of the present technology may be utilized to adjust via size and layout to create more uniform deposition in various regions. Additionally, in situations where reflow operations as will be described below may not be feasible, adjusting the layout in one or more ways may similarly improve co-planarity uniformity across the regions. To improve uniformity of fill, characterizations may be made, such as by running simulations of exemplary die patterns, which may be used to inform via or feature layout and sizing. For example, by performing one or more adjustments to the open area within a region, dimensional sizing adjustments of vias within different regions, or incorporating dummy vias within a region, fill rates may be adjusted to produce a more uniform fill rate in different regions, which may improve co-planarity across the zones.

Figure 3:
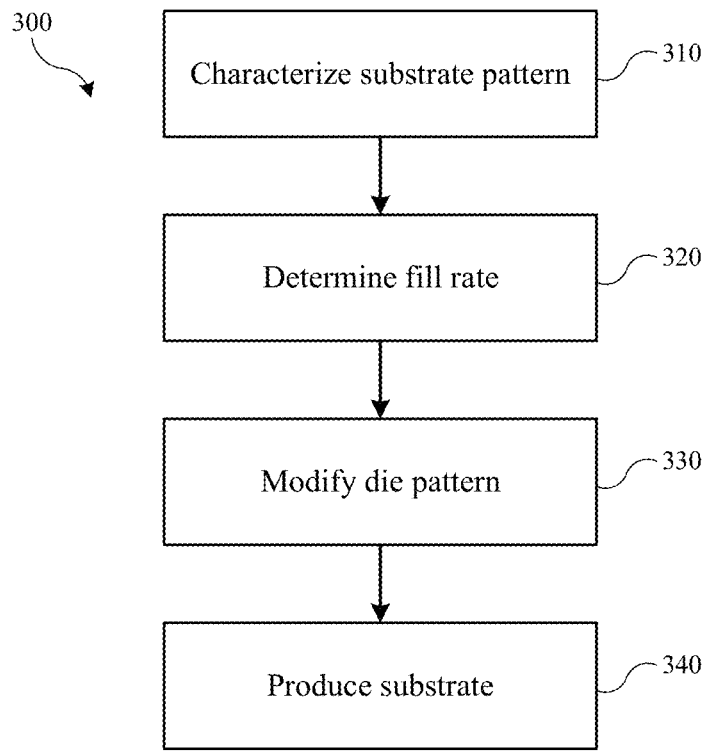
FIG. 3 shows selected operations in a method of producing semiconductor substrates according to some embodiments of the present technology.

FIG. 3 shows selected operations in a method 300 of producing semiconductor substrates according to some embodiments of the present technology. The method may include characterizing a substrate pattern at operation 310. For example, a device layout may be segregated into zones, such as illustrated in FIG. 2, which may be based on simulated fill rates within the zones. The characterization may take into account the number and pitch of the vias, as well as the size or critical dimension of individual vias. A simulation may then be performed to identify an amount of open area, and an estimated fill rate for each via may be determined for each via at operation 320, or within each zone.

Figure 4A:
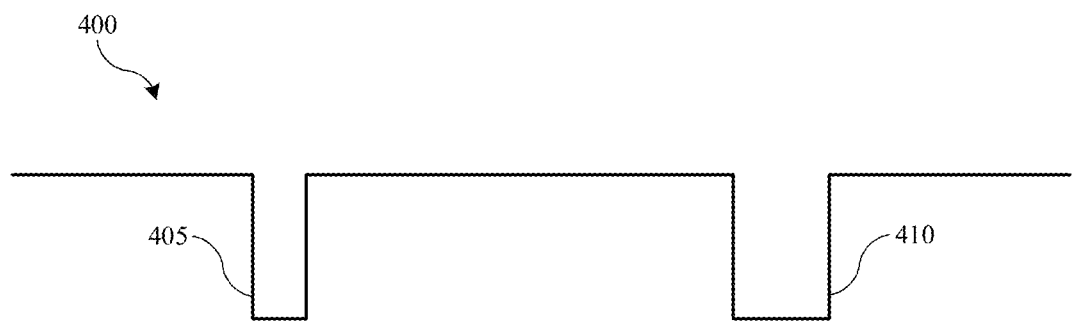
FIGS. 4A-4C show schematic cross-sectional views of features formed in a substrate according to some embodiments of the present technology.
Figure 4B:
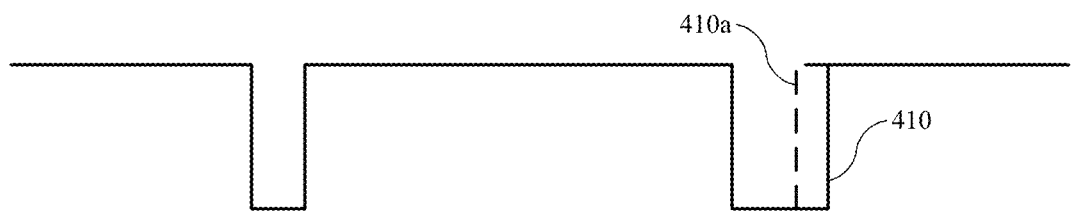
Figure 4C:
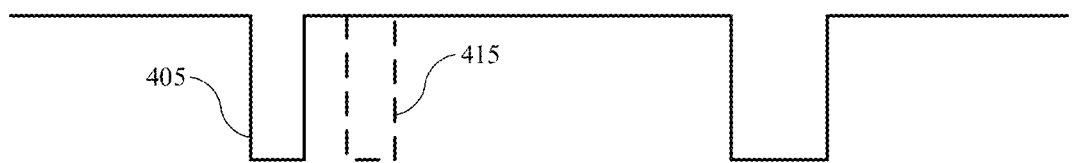

For example, an example resistance network model may be developed incorporating each of these factors to determine estimated fill rates. FIGS. 4A-4C show schematic cross-sectional views of features formed in a substrate 400 according to some embodiments of the present technology, and may be used in an exemplary simulation of rate affects, and adjustments that may be performed to increase rate uniformity across vias on the substrate. For example, FIG. 4A illustrates substrate 400, which may include an exemplary via in each of two zones. Via 405 may be characterized by a particular height, $h_1$, and width or radius, $r_1$, and via 410 may also be characterized by a particular height, $h_2$, and radius, $r_2$. In some embodiments, these vias may be characterized by different dimensions, which may affect fill rate within each via. Additionally, zonal characteristics may further affect the fill rate for each via. The simulation may account for the individual rate within a zone or via. For example, via 405 may be characterized by a fill rate of:

$$rate_1 = \frac{M}{\rho nF} \frac{I_1}{\pi r_1^2}$$

where M may be the molecular weight of the metal being deposited, ρ may be the density of the material, n may be the electrons transferred, F may be Faraday's constant, and I may be the current through the via. I may be calculated based on the height and radius of the formed geometry of the conductive material, and may be at least partially based on an estimated limiting current from a mass-transfer model. The rate through via 410 may be similarly calculated, and may be based on the different radius and current through that via. On a larger scale model, such as through hundreds or thousands of vias through different zones of a device, such as those described previously, each rate may be estimated to identify differentiation in fill rate, which may lead to different fill heights.

One or more modifications to the pattern may be made at operation 330, which may be used to adjust fill rates between two zones of a via, or between two or more vias. For example, FIG. 4B illustrates how vias may be adjusted to modify the fill rate, such as by adjusting r in the equation above. As illustrated, one possible modification encompassed by the present technology may include reducing the critical dimension or the radius of one or more vias. For example, via 410 may have the radius of the pattern reduced to be defined as via 410a, which may be characterized by a smaller radius, and which may affect fill rate. Via radius or critical dimensions may be modified for all vias within a zone, for example, and may be increased or decreased based on the current characteristics, percent of open area, or the fill rates of vias within the zone. In some embodiments the adjustments may be less than or about 20% of the original via radius or critical dimension, and may be less than or about 15% of the original radius, less than or about 10% of the original radius, less than or about 5% of the original radius, less than or about 3% of the original radius, or less than or about 1% of the original radius dimension.

Additionally, or alternatively, the percent open area in a zone may be modified as well. Adjusting via dimensions may be limited, where an allowable reduction in radius based on the device may not sufficiently compensate for the fill rate differences. Accordingly, adjusting open area characteristics may be performed as well. As illustrated in FIG. 4C, one or more dummy vias may be formed within a zone, which may adjust current characteristics within the zone, such as I in the rate equation included above. The percent open area may be increased or decreased by less than or about 50% of the percent open area, and in some embodiments may be increased or decreased by less than or about 40%, less than or about 30%, less than or about 20%, less than or about 15%, less than or about 10%, less than or about 9%, less than or about 8%, less than or about 7%, less than or about 6%, less than or about 5%, less than or about 4%, less than or about 3%, less than or about 2%, less than or about 1%, or less.

In one non-limiting example, dummy vias may be formed in certain regions or zones, such as about edge regions, for example. The dummy vias may be formed or removed to increase or decrease a percentage open area in a zone relative to another zone. For example, by increasing open area in a zone, plating in each via may be reduced. Thus, via 415 may be formed to reduce a fill rate of via 405, for example. Dummy vias may be formed to increase uniformity between zones, such as by reducing fill rate at edge regions, for example. Accordingly, a higher density of dummy bumps may be formed adjacent to an edge region, which may selectively improve fill uniformity within other zones. In some examples, an additional amount of dummy vias may be incorporated within one or more zones, and may include a number of dummy vias added that is less than or about 50% of the number of active vias within a zone, and in some embodiments a number of dummy vias added may be less than or about 40% of the number of active vias within a zone, less than or about 30% of the number of active vias within a zone, less than or about 20% of the number of active vias within a zone, less than or about 10% of the number of active vias within a zone, less than or about 5% of the number of active vias within a zone, less than or about 1% of the number of active vias within a zone, or less. After fill rate has been more closely paired between vias in different zones, the die pattern may be formalized, and a substrate may be produced at operation 340.

By modifying the substrate in one or more ways as described, a more uniform fill rate may be achieved. Thus, the fill height may be more consistent between vias, and more vias may be filled within a closer tolerance to the target fill height in each via. For example, in some embodiments, by performing adjustments as described, the fill height of any individual via, or of every via within a zone, may be within, as in above or below, about 25% of the target fill height for each via, and may be within about 20% of the target fill height, within about 15% of the target fill height, within about 10% of the target fill height, within about 9% of the target fill height, within about 8% of the target fill height, within about 7% of the target fill height, within about 6% of the target fill height, within about 5% of the target fill height, within about 4% of the target fill height, within about 3% of the target fill height, within about 2% of the target fill height, within about 1% of the target fill height, or may be substantially or essentially equal to the target fill height.

Figure 5:
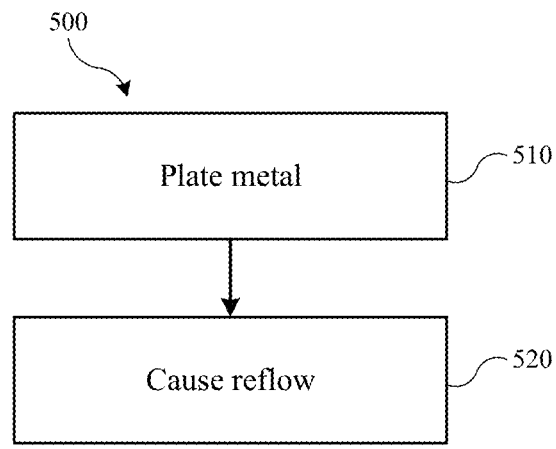
FIG. 5 shows selected operations in a method of filling features on a semiconductor substrates according to some embodiments of the present technology.

As previously explained, some devices may have fixed dimensions or layouts, which may limit the amount of adjustments that may be performed to via radius or layout. Some embodiments of the present technology additionally incorporate leveraging reflow characteristics when a flowable material may be incorporated within vias. FIG. 5 shows selected operations in a method 500 of filling features on a semiconductor substrates according to some embodiments of the present technology. The method may include plating a metal in operation 510, which may be plated in a plurality of vias on a semiconductor substrate, and which may be a device as described anywhere else in the present disclosure. The fill may be performed to a target average fill height, which may be based on a number of characteristics. For example, in some embodiments the target average fill height may be between about a thickness equal to an average via radius of the plurality of vias and a thickness twice the average via radius of the plurality of vias. Method 500 may also include heating the metal to cause reflow of the metal at operation 520.

Via filling may include a number of materials that are incorporated within the via, and may facilitate plating, contact, or material properties within the device. For example, fill within a via may include an amount of one or more conductive materials. Exemplary conductive materials may include copper, cobalt, tungsten, nickel, or any other material that may be used as a conductive trace within a semiconductor device. Some devices may have more than one layer of material, such as a layer of copper and/or a layer of nickel, and then another layer of copper, or any two materials, along with a variety of other variations similarly encompassed by the present technology.

In some embodiments an additional material may be incorporated on top of the other materials, and may include a material characterized by a lower melting point than any of the other noted materials. For example, a material may be included that may at least partially melt during bonding applications to increase contact area, for example. These materials may include any conductive material characterized by a melting point below or about 1000° C., for example. Because these operations may be performed during back-end-of-line processing, the thermal budget may be further reduced, and thus suitable materials may include materials characterized by a melting point below or about 500° C., below or about 450° C., below or about 400° C., below or about 350° C., below or about 300° C., below or about 250° C., below or about 200° C., below or about 150° C., below or about 100° C., or lower.

Any of these materials may be used to afford reflow during a heating operation, and in one non-limiting example, tin silver may be used as the additional material. As a final layer of material to achieve a particular conductive stack height, tin silver may be the metal plated in operation 510. As previously described, the current effects, via geometries, and other characteristics of the device may not afford equal plating within every via, and thus some vias may be at least slightly under filled relative to the target fill height, and some vias may be at least slightly over filled relative to the target fill height. The present technology may incorporate a reflow metal fill that occurs to a target height configured to produce a more uniform height profile after reflow.

Figure 6A:
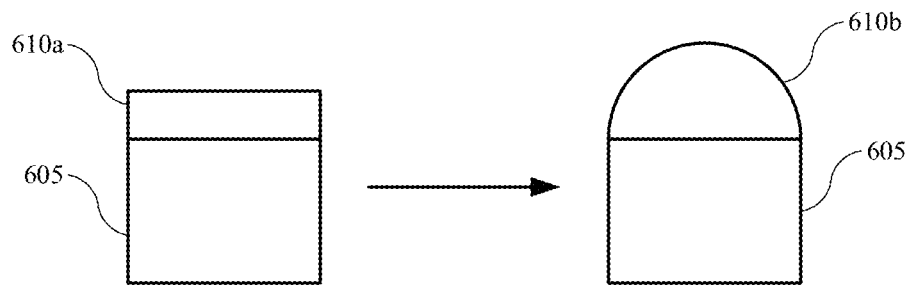
FIGS. 6A-6B show schematic elevation views of metal filling in features on a semiconductor substrate according to some embodiments of the present technology.
Figure 6B:
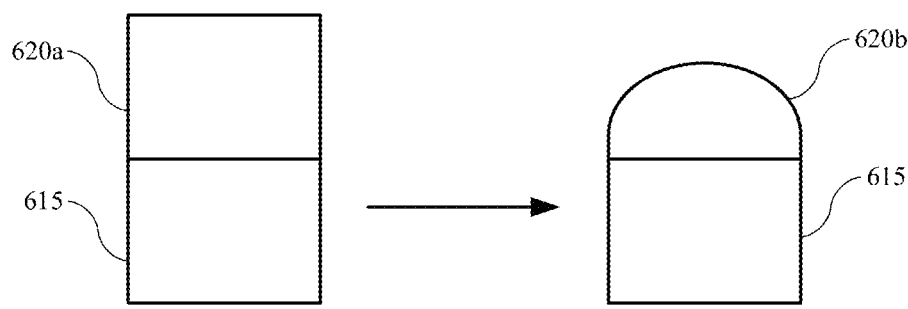

For example, tin silver or any other reflow material, may be used to produce a thickness of metal on top of a conductive stack. FIGS. 6A-6B show schematic elevation views of metal filling in features on a semiconductor substrate according to some embodiments of the present technology. As illustrated in FIG. 6A, stack metal 605 may include one or more layers of any of the fill metals previously described. Subsequently, an amount of additional reflow metal 610, such as tin silver, may be plated overlying the stack to a first thickness. The metal may take whatever geometry is the feature being filled, and for example, the pre-reflow metal 610a may take a cylindrical volumetric form within the via.

FIG. 6A may illustrate a via for which the fill height may be below the target average fill thickness of metal 610. However, in some embodiments of the present technology, after heating operation 520 has been performed to cause reflow, post-reflow metal 610b may adjust to an alternative form or geometry, such as a hemispherical volumetric form. Although the volume of metal may be substantially similar between the two forms, the reflow may increase the height of the metal, adjusting the metal upwards towards the target average fill thickness. FIG. 6B illustrates an additional via, which may similarly exist on the substrate, and based on any of the previously described factors, may have a fill of stack metal 615, which may be one or more layers of the metals identified previously, as well as an additional amount of reflow metal 620. As illustrated, FIG. 6B may be a via for which the fill height may be above the target average fill thickness of metal 620. However, in some embodiments of the present technology, after heating operation 520 has been performed to cause reflow, pre-reflow metal 620a may similarly adjust geometrically into a hemispherical form 620b. Again, although the volume of metal may be substantially similar between the two forms, the reflow may decrease the height of the metal, adjusting the metal downwards towards the target average fill thickness. Consequently, vias filled above or below the target, may be brought closer in line with the target via the reflow operation.

The benefits of improving uniformity subsequent reflow may be provided at least in part by performing a fill of the reflow metal within a particular target average thickness. The present technology may perform the plating operation of the reflow metal to a thickness within the above-stated range, which may afford the increases and decreases described. The different adjustments may occur due to the hemispherical formation relative to a particular thickness of material. For example, the volume of the cylindrically deposited material for both over and under filling may be characterized by a volume:

$$V_{plate} = \pi a^2 h_p$$

where a may be the radius of the plated material, and $h_p$ may be the height as plated. Once reflow has been performed, the geometry may shift to the hemispherical form and be characterized by a volume:

$$V_{reflow} = \frac{\pi h}{6}(3a^2 + h^2)$$

where a may again be the radius of the material, and h may be the height at a center of the hemisphere after reflow. Setting the plated volume to the reflow volume and solving for the reflow height gives the cubic expression:

$$h^3 + 3a^2 h - 6a^2 h_p = 0$$

Using Vieta's substitution to solve for the single real root of this cubic gives:

$$h = w - \frac{a^2}{w}$$

where w is calculated as:

$$w = \sqrt[3]{\frac{1}{2}(6a^2 h_p) + \sqrt{(6a^2 h_p)^2 + \frac{4(3a^2)^3}{27}}}$$

One resultant inflection point is identified by:

$$h = h_p \text{ for } h_p = \sqrt{3}\,a$$

Consequently, when the target average plating fill height is set to be about the square root of three times the radius, the reflow height is estimated to be substantially equal to the plating height. Thus, in some embodiments, the target average fill height may be determined to be within or about 20% of the height at which the pre-reflow plating height may be equal to the post-reflow plating height. In some embodiments, the target average fill height may be determined to be within or about 15% of the height at which pre and post-reflow plating height may be equal, and may be within or about 10% of the height, within or about 5% of the height, within or about 1% of the height, or substantially equal to the height.

Additionally, for vias where the plating height is below the square root of three times the radius, which could be due to any of the reasons identified previously, the hemispherical height will be greater than the plating height, thus bringing the post-reflow height up closer towards the target. Finally, when the plating height is above this the square root of three times the radius, again for any reason previously described, the hemispherical height will be less than the plating height, thus again bringing the post-reflow height down closer towards the target. Accordingly, by performing a fill operation with a reflow metal filled to a target height noted above, differences in fill height may be suppressed subsequent reflow. In some embodiments, overall stack height may include a specified target, and to accommodate the reflow metal height, adjustments to the stack metal may be made to increase and/or decrease average stack height to afford adequate space for the reflow metal to be filled to an average height as noted.

Figure 7:
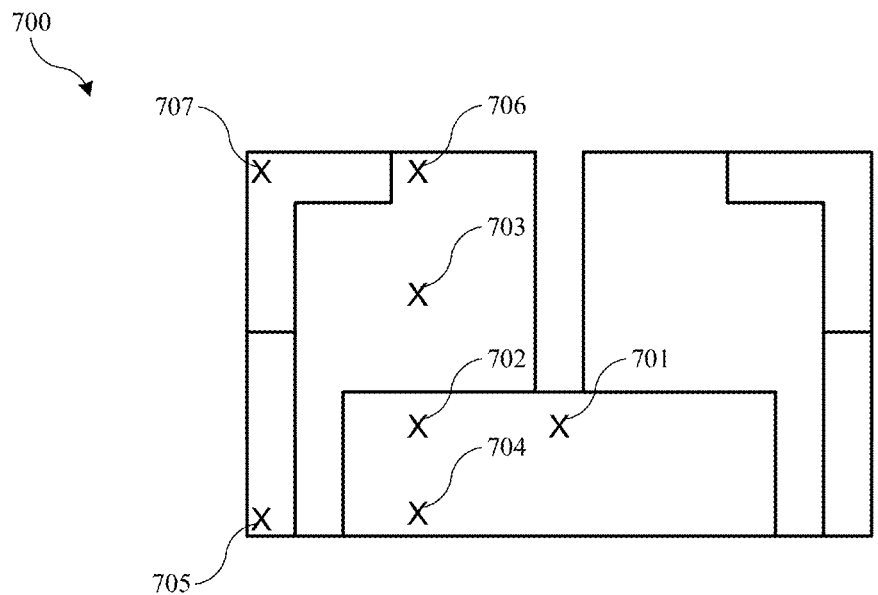
FIG. 7 shows a schematic top view of a zonal layout on a device according to some embodiments of the present technology.

Testing has verified that the reflow may be used to increase uniformity of co-planarity among vias across a substrate, and when reflow filling operations according to some embodiments of the present technology are combined with pattern adjustments described previously, further improvements may be afforded. FIG. 7 shows a schematic top view of a zonal layout on a device 700 according to some embodiments of the present technology. The zonal layout may have been performed as described previously. Vias were identified as testing parameters to verify the technology and improvements in uniformity. As noted, multiple testing points were checked pre-reflow after plating operations, and again post-reflow, as identified by the X locations on the structure in ascending numerical order. Multiple tests were performed that adjusted various aspects of the reflow metal fill height, as well as via layout and dimensions.

Figure 8A:
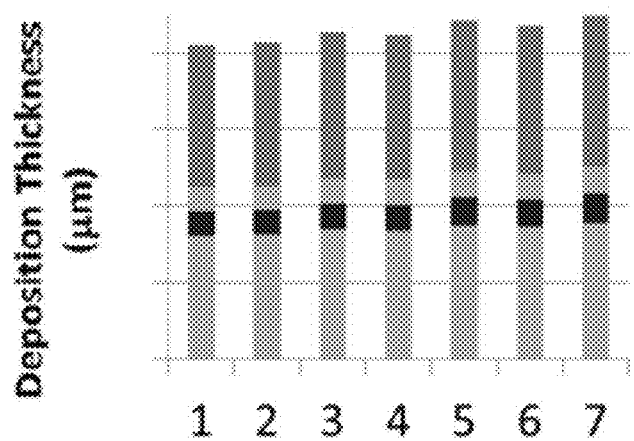
FIGS. 8A-8B show selected via fills pre and post reflow in modified features on a semiconductor substrate according to some embodiments of the present technology.
Figure 8B:
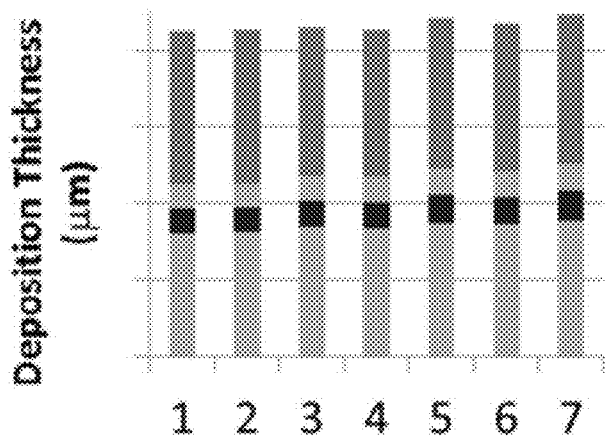

FIGS. 8A-8B show selected via fills pre and post reflow in modified features on a semiconductor substrate according to some embodiments of the present technology. Bars 1-7 correspond to points 701-707 on the substrate of FIG. 7 for a particular testing scenario in which via width was adjusted in some zones, percent open area was adjusted, and target fill height for a reflow metal was less than about twice the average via radius. FIG. 8A illustrates the fill height pre-reflow at the specified locations, and FIG. 8B illustrates the fill height post-reflow at the same locations. As shown, by adjusting fill profiles based on a target fill thickness of the reflow metal as listed, post reflow fill rates adjusted directionally towards the target for all vias. Accordingly, utilizing modifications according to the present technology, co-planarity may be improved among vias across a device, and in some embodiments via fill height for any individual via may be within any bounds of the target fill height as previously noted.

Figure 9:
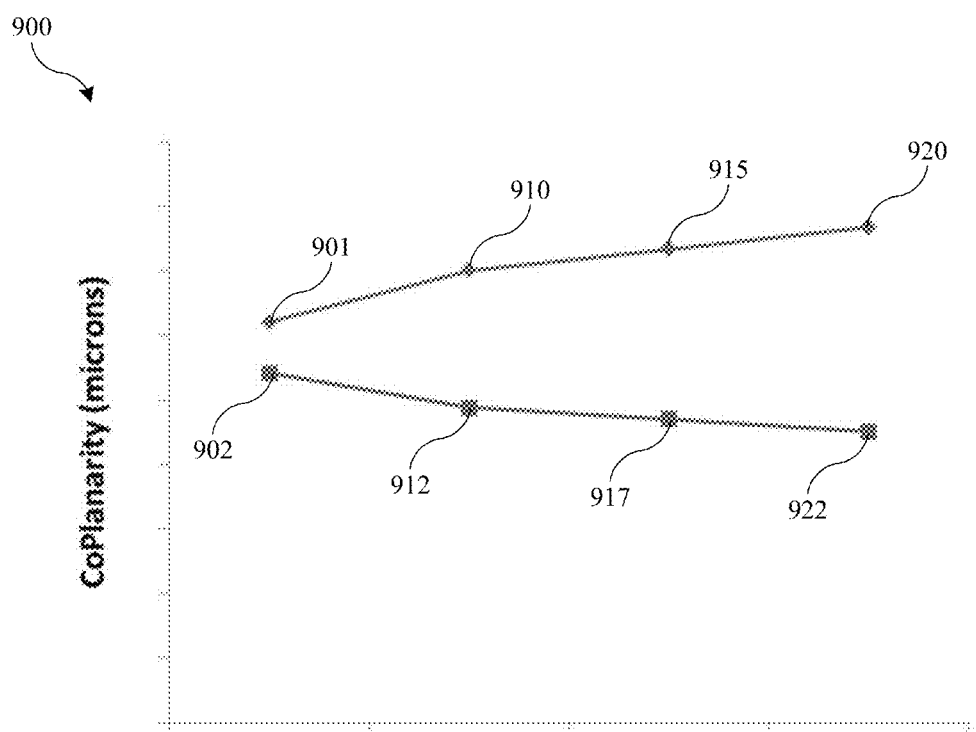
FIG. 9 shows a chart identifying pre and post reflow trends for features on a semiconductor substrate according to some embodiments of the present technology.

The adjustments made may produce virtually counterintuitive results relative to conventional technology, where exacerbating deviations across vias in pre-reflow filling may actually decrease deviations post reflow. FIG. 9 shows a chart 900 identifying pre and post reflow trends for features on a number of semiconductor substrates according to some embodiments of the present technology. The upper line illustrated includes a pre-reflow deviation from co-planarity for vias formed across the substrate, and the lower line illustrated includes a post-reflow deviation from co-planarity for the same vias. Points 901 and 902 indicate a reference conventional technique of formation, in which a fill was performed in an attempt to limit deviation. Points 910 and 912 illustrate a test substrate where via radius was reduced at certain positions relative to the reference, with a minor increase in the reflow metal thickness. As illustrated, pre-reflow deviation from co-planarity increased, which may indicate a worse scenario. However, post-reflow, deviation was actually reduced relative to the reference.

Points 915 and 917 illustrate a test substrate where via radius was further modified in certain zones relative to the reference, percent open area was further reduced, and further increase in reflow metal thickness was performed. Again, pre-reflow deviation was increased further negatively, while post-reflow deviation was further improved. Finally, points 920 and 922 illustrate a test substrate where vias radius was further modified, percent open area was further reduced, and reflow metal plating thickness was increased further to a target average thickness of between about 1.5 times the average via radius and about twice the average via radius. As illustrated, pre-reflow disparities were further exacerbated, while further improvements actually occurred post reflow. Accordingly, despite the present technology producing increased disparity and reduced uniformity pre-reflow in some embodiments, which may seem to dissuade performance of the techniques, by performing modifications according to embodiments of the present technology, post-reflow uniformity may be substantially improved.

In the preceding description, for the purposes of explanation, numerous details have been set forth in order to provide an understanding of various embodiments of the present technology. It will be apparent to one skilled in the art, however, that certain embodiments may be practiced without some of these details, or with additional details. For example, other substrates that may benefit from the fill techniques described may also be used with the present technology.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included. Where multiple values are provided in a list, any range encompassing or based on any of those values is similarly specifically disclosed.

As used herein and in the appended claims, the singular forms "a", "an", and "the" include plural references unless the context clearly dictates otherwise. Thus, for example, reference to "a material" includes a plurality of such materials, and reference to "the agent" includes reference to one or more agents and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

What is claimed is:

1. A method of filling vias in a semiconductor substrate, the method comprising:
    plating a metal within a plurality of vias on the semiconductor substrate, wherein a target average fill thickness of the metal within the plurality of vias is between about a thickness equal to an average via radius of the plurality of vias and a thickness twice the average via radius of the plurality of vias, wherein at least one via of the plurality of vias is filled to a height below the target average fill thickness of the metal, and wherein a second via of the plurality of vias separate from the at least one via and having the metal within the at least one via filled to a height above the target average fill thickness of the metal; and
    heating the metal to cause reflow of the metal within each via of the plurality of vias, wherein the reflow adjusts the metal within the at least one via to increase in height towards the target average fill thickness, and wherein the reflow adjusts the metal within the second via to decrease in height towards the target average fill thickness of the metal.

2. The method of filling vias in a semiconductor substrate of claim 1, wherein the target average fill thickness of the metal within the plurality of vias is about equal to the average via radius of the plurality of vias times about 1.5 to about 2.

3. The method of filling vias in a semiconductor substrate of claim 1, wherein the metal is a first metal and wherein the first metal is formed overlying a second metal within each via of the plurality of vias.

4. The method of filling vias in a semiconductor substrate of claim 3, wherein the first metal is characterized by a melting point below or about 200° C.

5. The method of filling vias in a semiconductor substrate of claim 3, wherein the first metal comprises tin silver, and wherein the second metal comprises one or more metals selected from the group consisting of copper, cobalt, nickel, and tungsten.

6. The method of filling vias in a semiconductor substrate of claim 5, further comprising a third metal formed within each via of the plurality of vias, wherein the second metal comprises copper, and wherein the third metal comprises nickel.

7. The method of filling vias in a semiconductor substrate of claim 1, wherein adjusting the metal within the at least one via of the plurality of vias comprises modifying a geometry of the metal within the at least one via of the plurality of vias.

8. The method of filling vias in a semiconductor substrate of claim 7, wherein the metal is characterized by a pre-reflow cylindrical geometry and wherein the metal is characterized by a post-reflow hemispherical geometry.

9. A method of producing a semiconductor substrate, the method comprising:
    characterizing a substrate pattern to identify a zonal distribution of a plurality of vias and a height and a radius of each via of the plurality of vias;
    determining a fill rate for each via within the zonal distribution of the plurality of vias;
    modifying a die pattern to adjust via fill rates between two zones of vias;
    producing a semiconductor substrate according to the die pattern;
    plating a metal within the plurality of vias on the semiconductor substrate produced, wherein a target average fill thickness of the metal within the plurality of vias is between about a thickness equal to an average via radius of the plurality of vias and a thickness twice the average via radius of the plurality of vias, wherein at least one via of the plurality of vias is filled to a height below the target average fill thickness of the metal, and wherein a second via of the plurality of vias separate from the at least one via and having the metal within the at least one via filled to a height above the target average fill thickness of the metal; and
    heating the metal to cause reflow of the metal within each via of the plurality of vias, wherein the reflow adjusts the metal within the at least one via to increase in height towards the target average fill thickness, and wherein the reflow adjusts the metal within the second via to decrease in height towards the target average fill thickness of the metal.

10. The method of producing a semiconductor substrate of claim 9, wherein, subsequent the reflow, a total fill height of metal within each via of the plurality of vias is within 5% of an average total fill height of metal within each via of the plurality of vias.

11. A method of filling vias in a semiconductor substrate, the method comprising:
    producing a semiconductor substrate according to a die pattern;
    plating a metal within a plurality of vias on the semiconductor substrate, wherein a target average fill thickness of the metal within the plurality of vias is between about a thickness equal to an average via radius of the plurality of vias and a thickness twice the average via radius of the plurality of vias, at least one via of the plurality of vias is filled to a height below the target average fill thickness of the metal, wherein a second via of the plurality of vias separate from the at least one via and having the metal within the at least one via filled to a height above the target average fill thickness of the metal; and
    heating the metal to cause reflow of the metal within each via of the plurality of vias, wherein the reflow adjusts the metal within the at least one via to increase in height towards the target average fill thickness, and wherein the reflow adjusts the metal within the second via to decrease in height towards the target average fill thickness of the metal.

12. The method of filling vias in a semiconductor substrate of claim 11, wherein the reflow adjusts the metal within the at least one via to increase in height towards the target average fill thickness.

13. The method of filling vias in a semiconductor substrate of claim 11, wherein the target average fill thickness of the metal within the plurality of vias is about equal to the average via radius of the plurality of vias times about 1.5 to about 2.

14. The method of filling vias in a semiconductor substrate of claim 11, further comprising:
    modifying the die pattern to adjust via fill rates between two zones of vias.

15. The method of filling vias in a semiconductor substrate of claim 11, wherein the metal is a first metal and wherein the first metal is formed overlying a second metal within each via of the plurality of vias.

16. The method of filling vias in a semiconductor substrate of claim 15, wherein the first metal comprises tin silver, and wherein the second metal comprises one or more metals selected from the group consisting of copper, cobalt, nickel, and tungsten.

17. The method of filling vias in a semiconductor substrate of claim 15, further comprising a third metal formed within each via of the plurality of vias, wherein the first metal comprises tin silver, wherein the second metal comprises copper, and wherein the third metal comprises nickel.

18. The method of filling vias in a semiconductor substrate of claim 11, subsequent the reflow, a total fill height of metal within each via of the plurality of vias is within 5% of an average total fill height of metal within each via of the plurality of vias.

* * * * *